United States Patent [19]

Behensky et al.

[11] 4,215,154
[45] Jul. 29, 1980

[54] PROCESS FOR PRODUCING SEMICONDUCTOR MATERIALS AND METALS OF HIGHEST PURITY

[75] Inventors: Gerhard Behensky; Josef Waldinger, both of Burghausen, Fed. Rep. of Germany

[73] Assignee: Wacker-Chemitronic Gesellschaft für Elektronik-Grundstoffe mbH, Burghausen, Fed. Rep. of Germany

[21] Appl. No.: 963,644

[22] Filed: Nov. 24, 1978

[30] Foreign Application Priority Data

Dec. 1, 1977 [DE] Fed. Rep. of Germany ....... 2753567

[51] Int. Cl.$^2$ .......................... B05D 5/12; B05D 3/14
[52] U.S. Cl. ...................................... 427/50; 219/482; 219/483; 219/494; 427/51; 427/86; 427/252
[58] Field of Search .................... 427/51, 50, 86, 252; 219/483, 482, 494; 307/37, 71, 117, 154

[56] References Cited

U.S. PATENT DOCUMENTS

| 2,981,605 | 4/1961 | Rummel | 427/51 |
| 3,053,638 | 9/1962 | Reiser | 427/51 |
| 3,171,755 | 3/1965 | Reuschel et al. | 427/51 |
| 3,941,900 | 3/1976 | Stut et al. | 427/86 |

FOREIGN PATENT DOCUMENTS

| 570421 | of 1958 | Belgium | 427/86 |
| 2147958 | 3/1973 | France | 427/51 |

*Primary Examiner*—John D. Smith
*Attorney, Agent, or Firm*—Allison C. Collard; Thomas M. Galgano

[57] ABSTRACT

A process for producing high purity semiconductor materials and metals by thermal decomposition of a gaseous compound of said materials, comprising the steps of arranging conductive carrier bodies in electrical current branches in a multi-phase a.c. system, then passing an equal amount of electrical current through each of the branches so as to heat the carrier bodies to deposition temperature, regulating the current in each of the branches so that the same magnitude of current flows through each branch.

4 Claims, 1 Drawing Figure

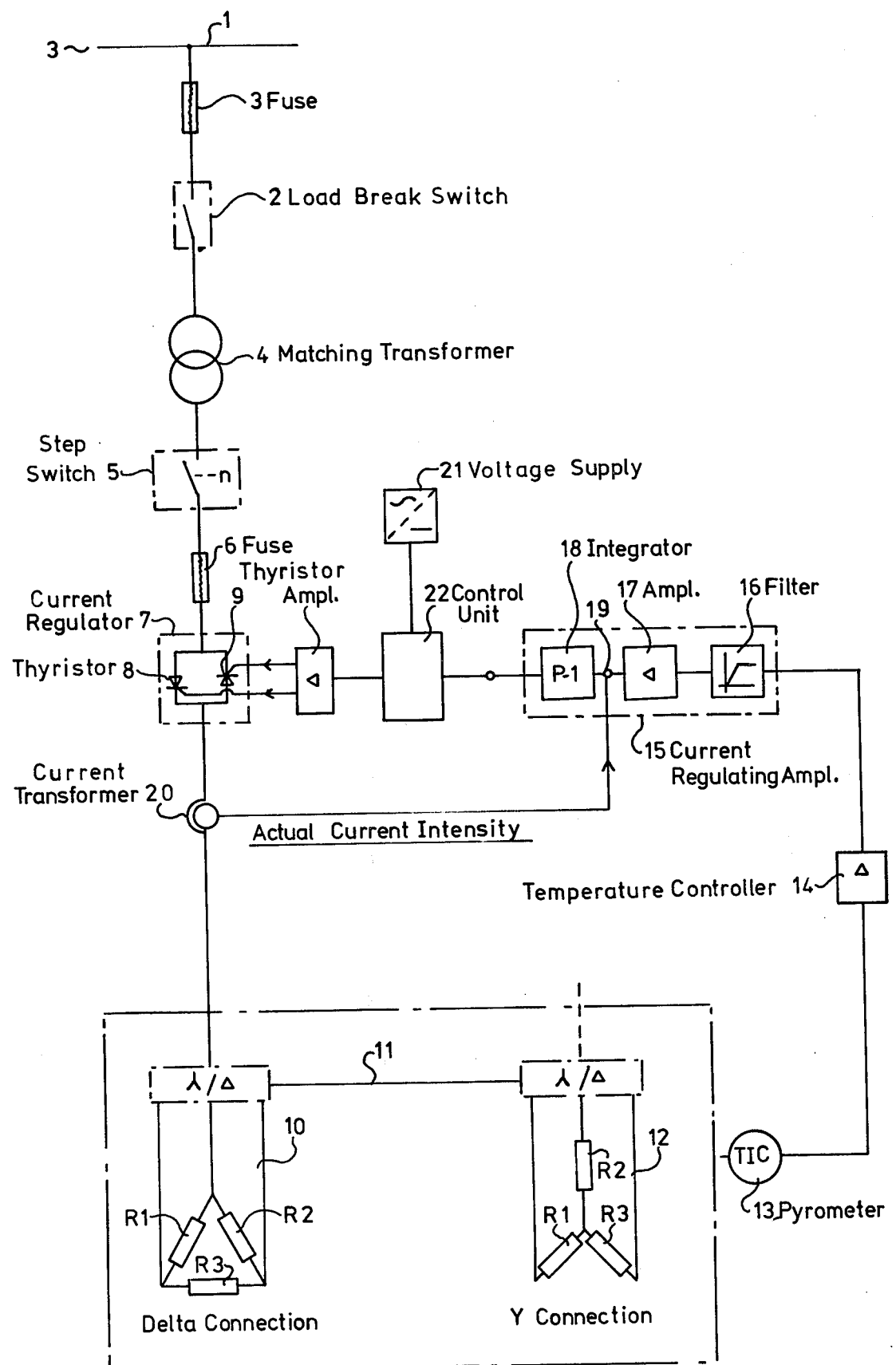

PROCESS FOR PRODUCING SEMICONDUCTOR MATERIALS AND METALS OF HIGHEST PURITY

The present invention relates to a process for producing semiconductor materials and metals of highest purity by thermal decomposition of gaseous compounds of the respective substances to be deposited on carrier rods, which are heated to the descomposition temperature by electric current.

In the production of silicone of highest purity, it is conventional to clamp one or more thin rods of silicon of highest purity in graphite electrodes in an apparatus which may, for example, consist of a base plate of silver and an inverted quartz bell fitted over the same. On the carrier rods, silicon is deposited by a decomposition of a mixture of gaseous hydrogen and trichlorosilane. For heating the, carrier rods, to deposition temperature, which substantially equals the decomposition temperature of the gaseous compound used in an individual case, an accurately defined electrical power is required per length of rod. Depending on the resistance of the rod, which decreases with rising rod temperature, a certain current or a certain voltage will adjust itself.

In order to be able to operate a deposition device with economical efficiency, usually several carrier rods are used. However, since all the rods must have the same temperature, otherwise the rods of higher temperature would grow faster in thickness than the cooler rods, the flow of current has to be equal through all rods. Due to the negative temperature characteristic of the resistance of silicon, the experts in this field were of the opinion that in order to guarantee equal current flow in the carrier rods, only a series connection of the carriers could be used. Now, the total length of all carrier bodies used in the deposition device is limited by the operational voltage, for which the equipment has been designed. An increase in the number and/or length of the carrier rods mounted in the deposition equipment could, for example, be brought about by a higher operational voltage. However, in many countries, there is a limit value in high tension or high voltage plants (in West Germany, it is 1000 volts,) about which there are considerably stricter rules to be observed, which, alone make the operation of production equipment at such high voltages, uneconomical. But even in countries which do not impose such safety regulations, it is not advisable to operate at such increased operational voltages, since they lead to an extraordinary increase in the danger for the operating personnel.

When, on the other hand, the operational voltage is not increased, the number and/or length of the carrier rods used in a given deposition device, can only be made to serve a useful purpose by a decrease of the electrical resistance of the carriers. This is, on the one hand, theoretically possible by using rods having greater diameters, which involves the disadvantage of higher processing costs for the carrier rods; on the other hand, by reducing the resistance of the carriers by doping with foreign atoms. This latter method is not applicable in most cases, because of the required purity of the final product, particularly in the production of highly resistant material.

A further possibility of compensating for the negative temperature characteristic of the resistance of the carrier bodies would be to activate the bodies, not by direct current flow, but by means of external heat, i.e., to heat them to a temperature at which the resistance in the carrier bodies is considerably decreased, so that a current flow at a comparatively lower voltage will be sufficient to raise the temperature of the carriers to decomposition temperature of the gaseous compound used for the deposition of the desired material. Such a process is, however, very expensive and uneconomical.

Finallly, in German application laid open for inspection (Offenlegungsschrift) also U.S. Pat. No. 3,941,900, a method is described in which an auxiliary source is used for the supply of n-phase alternating current, wherein the several phases of the supplied voltage are each applied to one group of the carrier bodies already arranged in series, so that all carrier bodies will be under voltage. In this case, too, the actual operation of the deposition equipment is carried out after activation with the serially-arranged carrier bodies, in order to guarantee that all rods will be passed through with an equal amount of current. This method has the disadvantage that to the individual rods, only a fraction of the available operational voltage is applied, which decreases with the increase of the number and/or length of the carrier rods. Thus, a better utilization of the deposition equipment is therefore quite limited.

It is the object of the present invention to provide improvements to the above-mentioned deposition processes, without exceeding the limit voltage of, e.g., 1000 volts, and to increase the number of carrier rods or their total length, while applying direct current passage to heat the carriers for obtaining the required decomposition temperature of the gaseous compound used.

Other objects and advantages of the process according to the present invention will become apparent from the following detailed description and the accompanying drawing.

The objects of the instant invention are accomplished by the arrangement of the carrier bodies throughout the entire operation, in several current branches, which are combined to form a multi-phase a.c. system, the branches carrying the same amount of current caused by appropriate control arrangements. The equal amount of current in the several branches can be controlled, e.g., by a regulating transformer, or a current-controlling transductor, or, preferably, by current-controlled thyristor adjusters. It is true that the current-controlled thyristor adjusters are more susceptible to becoming damaged than the current-controlling transductors, but they are more compact and space-saving.

Activation by heating is effected in the preferably used three-phase system, in the delta connection of the carrier bodies, because in that connection in each of the three current branches in which the carrier bodies are arranged, the complete line voltage is available. Consequently, assuming the operational voltage to be equal, three times as many carrier bodies can be activated than in series arrangement. If large deposition reactors were to be used than conventional at this date, a higher increase in the number of carrier bodies might be desirable for optimum utilization.

Activation of the carrier bodies is effected by applying the maximal voltage, e.g., the voltage for which the equipment is designed. In West Germany, this is usually 1000 volts. When the carrier bodies are arranged in delta connection, the voltage in each carrier or group of carriers is is equal to the line voltage, whereas the current passing through the carrier body, or the group of carrier bodies in the several group branches, respectively, is equal to the conductor current divided by $\sqrt{3}$. When the voltage is applied, initially a weak current will pass through, due to the resistance of the carrier bodies. The flow of current causes a rise in temperature in the carrier bodies, which, in turn, results in a decrease in the resistance, so that a stronger current will then pass through the carrier bodies, which leads to another temperature rise in the carrier bodies.

This process is controlled by comparing the actual value of the carrier bodies' temperature, determined by means of a temperature measuring device, with the desired temperature value previously adjusted in the temperature-control device. In this manner, a temperature equilibrium is achieved in the reaction chamber of the deposition apparatus. By the decrease in the resistance of the carrier bodies occurring simultaneously with the increase in temperature, the current increases during the activation, until it reaches a pre-adjusted desirable value, while the voltage decreases at the same time. In order that all carrier bodies are heated up to the same temperature, it is a prerequisite that all the bodies, or group of bodies receive the same amount of current, and that is accomplished by the above described circuitry.

During the deposition process, the diameter of the carrier bodies increases. To maintain a certain deposition temperature at a constant level (normally the temperature is about 1150° C. to 1250° C. in the deposition of Si from mixtures of hydrogen and trichlorosilane,) the current passing through the carrier bodies has to be continually increased. This is accomplished by temperature regulation with simultaneous current regulation. As the diameter of the carrier body is increased, its resistance is decreased. This involves a decrease of the voltage with increasing current intensity, since the required load does not increase proportionately with the decrease of resistance.

A divergence of the rod temperatures and diameters of the several carrier bodies is prevented by making the flow of current through all the carrier bodies of a deposition apparatus equal. A certain carrier body delivers the lead variable for the temperature control. The equalizing tendency of this arrangement is due to the fact that when a carrier body assumes a larger diameter than the lead body, the amount of current being equal, the temperature of said body, and therewith the rate of deposition, will decrease per time unit.

On the other hand, should one of the carrier bodies have a smaller diameter compared to the lead, a short-time increase in temperature will result in a higher rate of deposition per time unit.

For an economical rating of the matching transformer upon decrease to a certain voltage, it is preferable to switch over from the delta-connection (generally polygon connection when using n-phase alternating current,) to "Y" connection of the carrier bodies. After the switch-over, the line current $I_L$ decreases by the factor $\sqrt{3}$, (generally, $\sqrt{n}$,) and the line voltage increases by the same factor, considering that the values remain the same, relative to the carrier body.

| "Y" Circuit | Delta Circuit |
|---|---|
| $V_{line} = V_{carrier} \cdot \sqrt{3}$ | $V_{line} = V_{carrier}$ |
| $I_{line} = I_{carrier}$ | $I_{line} = I_{carrier} \cdot \sqrt{3}$ |

In the following Example, the results of the switch-over will be better understood:

EXAMPLE.
(1) Before the switch-over:

$$\Delta : I_L = 700A;\ I_{carrier} = \frac{I_L}{\sqrt{3}} = \frac{700}{\sqrt{3}} = 405A$$

$$V_L = 100V\ V_{carrier} = 100V$$

(2) After the switch-over:

$$Y : I_L = I_{carrier} = 405A$$

$$V_L = V_{carrier} \cdot \sqrt{3} = 100 \cdot \sqrt{3} = 173V$$

The process is suitable for the production of semiconductor material of highest purity, e.g., germanium, silicon carbide, or, preferably, silicon. As depositing reactors, the conventional apparatus made of quartz, or of metal, are used, which must be equipped with a temperature-measuring device for at least one carrier rod. The measuring device comprises, usually, a quartz window arranged in the outer shell of the reactor, through which the temperature of one or several carrier rods can be determined by a pyrometer.

As decomposable gaseous compounds, the usual halogen or halogen-hydrogen compounds are used, which are mostly diluted with hydrogen or an inert gas; in the case of silicon carbide, the mixture used contains a decomposable hydrocarbon compound, in case on the other hand it is preferable to start out initially with an organo-silicon compound, e.g., tetramethylsilane. The present invention, which provides a practical, simple and inexpensive method for heating carrier bodies in deposition processes of semiconductor materials, is also very suitable for manufacturing metals of highest purity, particularly of the so-called refractory metals as, e.g., vanadium, titanium, niobium, neodymium, zirconium, or tantalum.

According to the process of the present invention, it is possible to arrange a much larger number of carrier bodies or substantially longer bodies in the reactor at the same operational voltage, which results in an increase in yield per time unit and equipment, and a reduction in the specific energy expended, as well as a reduction of labor spent per unit of weight.

The accompanying drawing shows schematically (by way of example for a three-phase a.c. system,) the arrangement of the several units and their connections in a conventional deposition apparatus, also illustrating the current supply for the built-in carrier bodies. In the drawing, the main voltage (3-phase a.c.) designated by 1 is supplied to a current regulator 7 by a number of connecting elements, namely, an load break switch 2, with a fuse 3 being inserted between 1 and 2. Following the load break switch is a matching transformer 4, which reduces the main voltage to the voltage required in the instant process. Part of the arrangement is also a step-switch 5 and a fuse 6. Current regulator 7 is in this case a current controlled thyristor adjuster with semiconductor valves, e.g., thyristors 8 and 9. Fuse 6 serves to protect the thyristors against excess current. Three groups carrier bodies $R_1$, $R_2$, and $R_3$ are arranged in the three branches of a 3-phase a.c. current system and are preferably in delta connection 10 for activation. If the equipment or apparatus is designed, e.g., for a maximum operational voltage of 1000 V, in the several current branches, silicon carrier rods of, e.g., approximately 4.5 m in length and a thickness of 0.5 cm, can be arranged in series. This is usually done by connecting two carrier rods, by means of a current bridge, preferably likewise consisting of silicon, the two rods being preferably held in water-cooled graphite electrodes mounted in the bottom plate of the deposition reactor (not shown). After activation of the carrier rods, i.e., when the initial voltage has dropped to half its value - in the instant case from 1000 V to 500 V - it is advisable to switchover from the delta connection to the "Y" connection 12 by means of a switch-over device 11, in order to guarantee an economical utilization of the matching transformer.

Matching transformer 4 is preferably provided with several secondary windings which are adapted, as far as current and voltage are concerned, to the power consumption diagram of the deposition process. By this adjustment of transformer 4 in combination with stepswitch 5 and the switch-over device 11 from a delta to "Y" connection, a rough regulation of current and voltage are obtained. The following current-controlled thyristor adjuster 7 then takes over within each stage the fine regulation of the current, which is always necessary for maintaining the required level of the deposition temperature. The acutal temperature value determining the current regulation is observed by means of a temperature measuring device 13, e.g., a pyrometer absorbing the radiant heat of a carrier body through a quartz window in the shell of the deposition apparatus, the carrier body delivers the lead variable for the other carriers; the pyrometer then emits a measuring signal to a temperature control device 14, where the measured actual value is compared to a desired temperature value.

The adjusted value of the temperature regulating device 14 constitutes the desired value for the following current regulating amplifier. Amplifier 15 is a proportional integral amplifier, and it consists essentially of a unit 16 forming the characteristic lines, which unit filters out the disturbing voltages from the input signal, and further, the amplifier proper 17, which amplifies the input signal, and an electronic unit 18, which determines the proportional integral behavior of the amplifier.

Based on the output signal transmitted from temperature control device 14, the desired value for the current is adjusted with the actual current value in amplifier 15. The measuring signal of the actual current value is transformed by a current transformer 20 to a measurable value, for instance, to a value which in comparison to the actual current, is reduced by the factor $10^{-3}$. The comparison between the actual current value 19 passing through the carriers and the desired temperature value leads to a certain output signal of the amplifier 15, which signal is transformed by means of a control unit 22, having its own voltage supply 21, into rectangular pulses, such as are needed for the control of thyristors, these pulses then reaching the thyristor adjuster 7. The output signal from current regulating amplifier 15 determines, after transformation into pulses, the control range of the controllable semiconductor valves e.g. the thyristors in the thyristor adjuster and, thus, controls the temperature of the carrier bodies by way of the current passing through the bodies.

The deposition temperature of the rods, which corresponds to the decomposition temperature of the gaseous compound used in any individual case, is reached by slow gradual or stepwise increase of the pre-determined desired value of the temperature. This gradual or stepwise increase of the desired value, or, after deposition, gradual or stepwise decrease of the desired value, can be done manually or by means of an appropriately programmed process computer.

While only a single embodiment of the present invention has been shown and described, it will be obvious to those persons of ordinary skill in the art, that many changes and modifications may be made thereunto, without departing from the spirit and scope of the invention.

What is claimed is:

1. A process for producing high purity silicon semiconductor materials and metals by thermal decomposition of a gaseous compound containing the silicon semiconductor material or metal passing over the carrier bodies, comprising the steps of:

arranging the silicon carrier bodies into branches in a multiphase delta electrical connection during the start of the deposition process;

passing an equal amount of electrical current through each of the branches of the delta connection, so as to heat the carrier bodies to deposition temperature;

regulating the current in each of the delta branches by means of current-controlled regulator circuits, so that the same current flows through each delta branch;

switching over said multiphasedelta connection to a multiphase Y connection after the carrier bodies reach a predetermined resistance after being heated, so that the branch current decreases by $\sqrt{n}$ and the line voltage increases by $\sqrt{n}$ where n equals the number of phases in the line; and passing a gaseous compound containing the semiconductor material or metal over the carrier bodies.

2. The process according to claim 1, wherein carrier bodies are arranged in a 3-phase alternating current system.

3. The process according to claim 2, wherein said step of current regulation comprises current controlled thyristors disposed in series with the branches for adjusting the same magnitude of current in the several branches.

4. The process as recited in claim 3, comprising a pyrometer optically coupled to said carrier bodies and electrically coupled to said thrystors for regulating the current to said branches so that the carrier bodies will be heated and maintained at the deposition temperature of the gaseous compound.

* * * * *